United States Patent [19]

Tanaka et al.

[11] 4,425,637

[45] Jan. 10, 1984

[54] OPTICAL RECORDING APPARATUS

[75] Inventors: Shinichi Tanaka, Kyoto; Tadashi Abe, Hirakata, both of Japan

[73] Assignee: Matsushita Electric Industrial Co., Ltd., Osaka, Japan

[21] Appl. No.: 316,908

[22] Filed: Oct. 30, 1981

[30] Foreign Application Priority Data

Oct. 31, 1980 [JP] Japan ............................ 55-152115

[51] Int. Cl.³ ........................ G11B 7/00; H04N 5/781
[52] U.S. Cl. ............................... 369/124; 358/342; 358/347; 369/128; 369/109
[58] Field of Search ............ 358/332, 333, 342, 345, 358/347, 348; 369/48, 59, 60, 64, 109, 121, 124, 125, 132, 128, 32

[56] References Cited

U.S. PATENT DOCUMENTS 3,988,531 10/1976 Laub .............................. 358/342 X
3,988,532 10/1976 Korpel ........................... 369/124 X
4,222,072 9/1980 Bailey et al. ....................... 358/342

*Primary Examiner*—Robert L. Richardson
*Attorney, Agent, or Firm*—Wenderoth, Lind & Ponack

[57] ABSTRACT

An optical recording apparatus for recording digital signals controls the pulse length of the recorded signals by delaying either the positive-going edges or the negative-going edges of the digital signals. The edges are delayed by either a logical AND or a logical OR operation between an original digital signal and a delayed signal or between an original digital signal and an output signal from a monostable multivibrator which has been triggered by an edge of the original digital signal.

11 Claims, 32 Drawing Figures

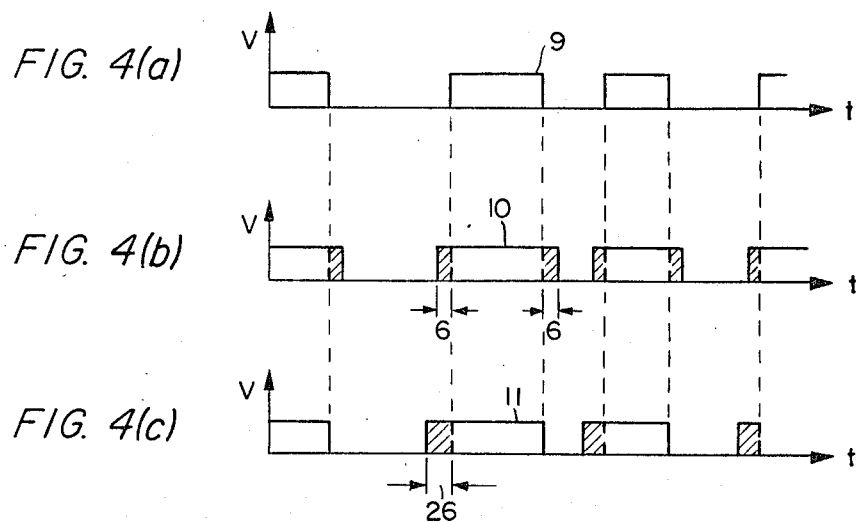
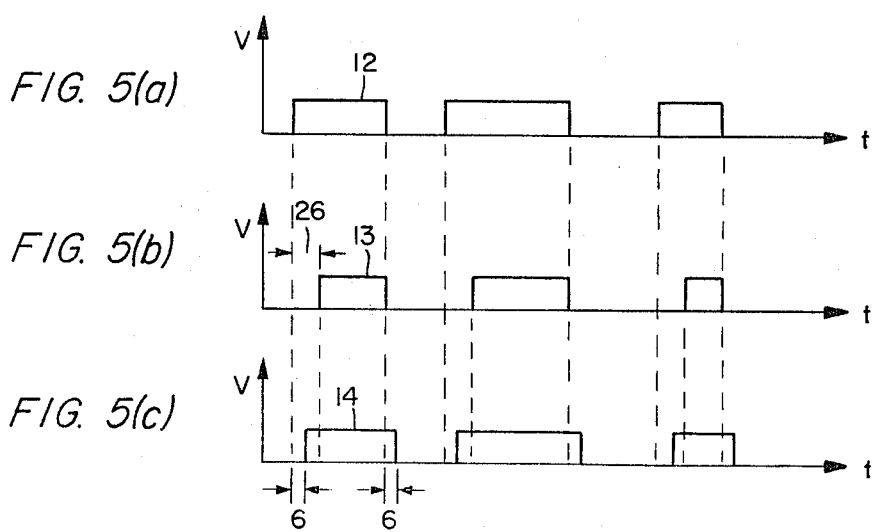
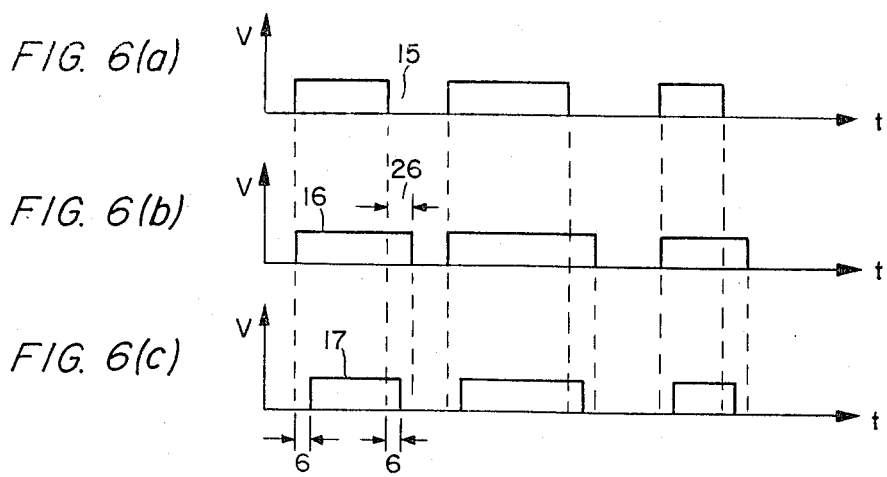

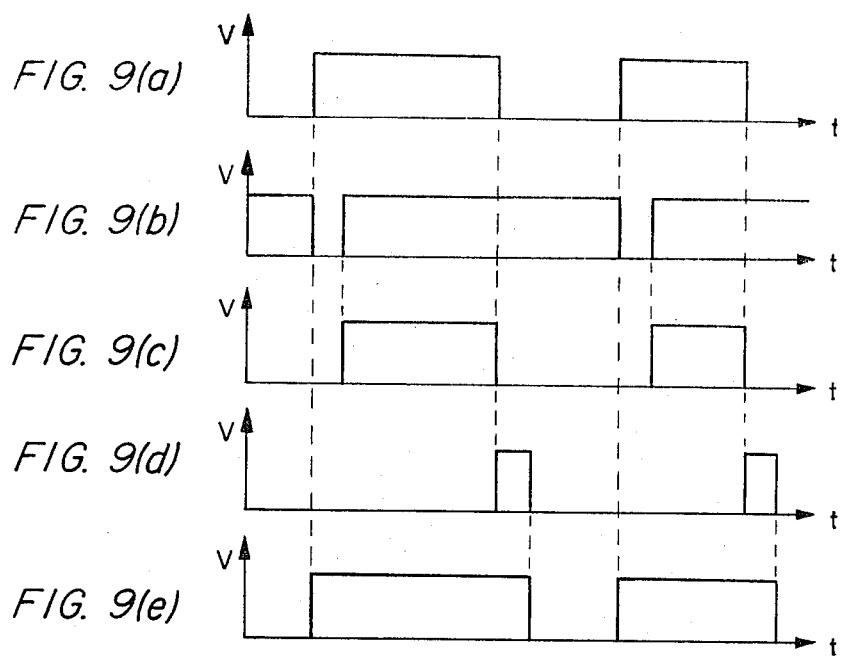
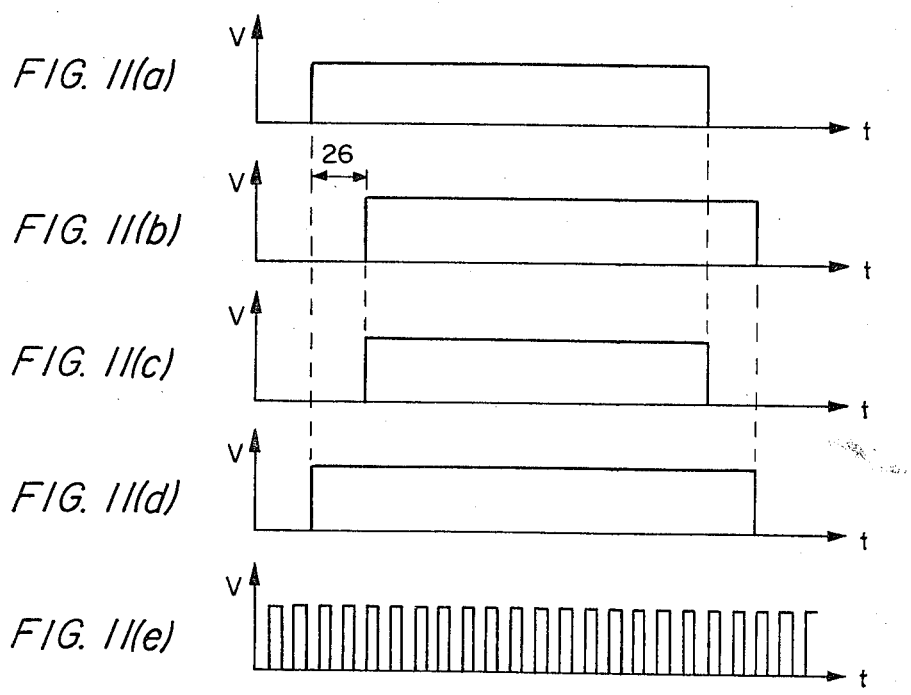

OPTICAL RECORDING APPARATUS

BACKGROUND OF THE INVENTION

This invention relates to an optical recording apparatus for recording digital signals. More particularly, this invention relates to the control of a duty ratio of the recorded original digital signals.

In general, optically read-out signals are different from the recorded original signals with respect to their duty ratio, because an effective length of a written part on a recording medium is different from the pulse length of the recorded original signal.

In this invention, digital signals which will be recorded are varied in their pulse lengths in order that the read-out signals may coincide with the original recorded signals with respect to their duty ratio.

SUMMARY OF THE INVENTION

An optical recording apparatus for recording a digital signal on a recording medium according to the present invention comprises: an input terminal to which a digital signal is inputted; a delaying means which is operatively coupled to said input terminal for delaying edges of said pulses a so as to produce edge-delayed pulses; light beam generating means which is operatively coupled to said delaying means for generating a amplitude-modulated light beam under the actuation of said edge-delayed pulses; a converging means which is operatively coupled to said light beam generating means for converging said amplitude-modulated light beam to form a writing light spot on said recording medium; and a moving means which is operatively coupled to said recording medium for moving said recording medium at a constant velocity relative to said writing light spot, whereby the length of written part on said recording medium is controlled by said delaying means.

The pulse length of a digital signal is varied by delaying either its positive-going edges or its negative-going edges. The positive-going edges can be delayed by a logical AND operation between either the original signal and negative one-shot pulses from a monostable multivibrator which is triggered by the positive-going edges of said original digital signal or between the original digital signal and a simply delayed version of said original digital signal. Then, the pulse length increases. The negative-going edges can be delayed by a logical OR operation between either the original signal and positive one-shot pulses from a monostable multivibrator which is triggered by the negative-going edges of said original digital signal or between the original digital signal and a simply delayed version of said original digital signal. Then, the pulse length decreases.

In this way, the duty ratio of the recorded signal is controlled in order that the duty ratio of the read-out signal may coincide with that of the original digital signal.

BRIEF DESCRIPTION OF THE DRAWINGS

The present invention will now be described in detail with reference to the accompanying drawings in which:

FIG. 4 shows the difference in the duty ratio between a read-out signal and an original signal recorded by a usual method;

FIG. 5 and FIG. 6 show equalization between a read-out signal and an original signal recorded by the method of the present invention;

FIGS. 9(a)–9(e) show waveforms at points of the block diagram shown in FIGS. 8(a), 8(b) and 8(c);

FIGS. 11(a)–11(e) show waveforms at points of the block diagram shown in FIGS. 10(a), 10(b) and 10(c).

DESCRIPTION OF THE PREFERRED EMBODIMENT

When a digital signal is optically recorded on a recording medium, a light beam which is modulated by said digital signal converges to become a writing light spot on said recording medium. Said writing light spot relatively travels across the surface of said recording medium to form an information track. Because the light beam is modulated by the digital signal, the recording material is transformed along an information track corresponding to the recorded digital signal. The part where said transformation is caused will be called the written part. In the following description, it will be assumed that said written part is formed to correspond to a positive pulse of said digital signal.

In general, the length of the written part does not precisely coincide with the corresponding pulse length of the recorded original digital signal, because the shape of the writing light spot is a small circle and its size cannot be neglected in comparison with said length of the written part.

Figure 1:
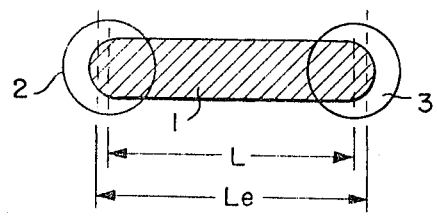
FIG. 1 shows the relationship between the traveling distance of a writing light spot and the length of the written part.

FIG. 1 shows the relationship between the traveling distance of the writing light spot and the written part. The writing light spot travels from a position 2 to a position 3 while a pulse of the original digital signal is in effect and forms a written part 1. The outline of the written part 1 is smaller than the envelope of the traveling writing light spot, because the power distribution of the writing light spot gradually decreases in an outward radial direction and the sensitivity of the recording medium is usually critical. The traveling distance L of the writing light spot, that is, the distance from the center of the position 2 to the center of the position 3, just coincides with the corresponding pulse length of the digital signal, but does not coincide with an effective length $L_e$ of the written part 1. Accordingly, the duty ratio of the read-out signal generally does not coincide with the duty ratio of the original recorded signal.

Figure 2:
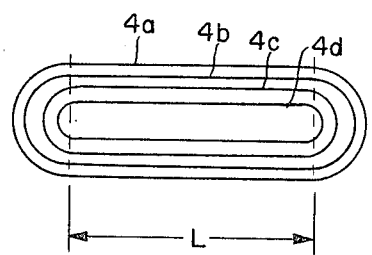
FIG. 2 shows a variation of an outline of a written part in accordance with a variation of the writing light power.

The effective length of the written part can be equalized with respect to the pulse length of the original digital signal by controlling the intensity of the writing light spot. FIG. 2 shows a variation of the outline of the written part in accordance with a variation of a writing light power. When the writing light power is reduced, the outline of the written part becomes smaller (in sequence: 4a, 4b, 4c and 4d). Therefore, the effective length of the written part is proper, that is, said length coincides with the pulse length of the original digital signal when a proper writing light power is selected. But the width of the written part is generally improper when the writing light power is selected so as to make the length of the written part proper.

Figure 3A:
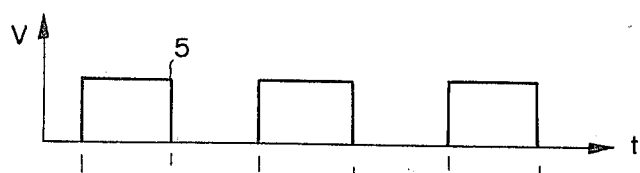
FIGS. 3(a)–3(d) show a process for generating a distorted read-out signal from a recorded signal.
Figure 3B:
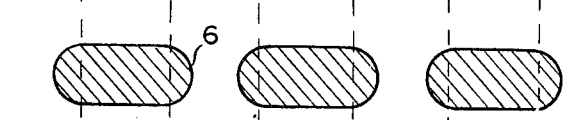
Figure 3C:
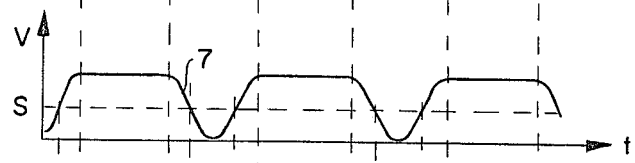
Figure 3D:
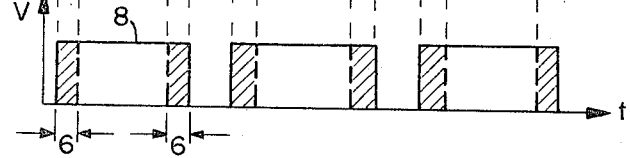

This invention solves the defect mentioned above to provide an optical recording apparatus which forms said written part with a proper length and a proper width. FIGS. 3(a)–3(d) show the process of generating distortions in the read-out signal through a usual optical recording and reading. FIG. 3(a) shows a waveform of an original digital signal which should be recorded. A written part 6 is formed as shown in FIG. 3(b). In this example, the effective length of said written part 6 is longer than the length of the corresponding pulse 5 of the original signal. FIG. 3(c) shows the waveform of a read-out signal 7. Said read-out signal is compared with a threshold level S in order to be shaped. After the shaping, the read-out digital signal is obtained as shown in FIG. 3(d). The length of a pulse 8 of said read-out digital signal is dependent on the threshold level S. The length of the pulse 8 of the read-out digital signal can be approximated by controlling said threshold level S. But said threshold level S is generally desired to be near the center of the amplitude of said read-out signal, because, when the threshold level is set near the highest level or the lowest level of the read-out signal, the shaping is considerably disturbed by noise and intersymbol interference.

On the other hand, when the threshold level S is set at the center of the amplitude of the read-out signal, the length of the pulse 8 of the read-out digital signal is generally different from the length of the pulse 5 of the original digital signal; that is, the duty ratio of the read-out digital signal is generally different from that of the original digital signal. In this example, the pulse 8 of the read-out digital signal has been lengthened by the time δ at each edge of said pulse 8. This increase of pulse length is constant on each pulse and is independent of the pulse length of the original digital signal.

The relationship between the original digital signal and the read-out digital signal will be shown in more detail in FIGS. 4(a)–4(c). FIG. 4(a) shows an original digital signal 9 which consists of pulses of various lengths. Every pulse of the read-out digital signal 10 has been lengthened by the time δ at each edge as shown in FIG. 4(b). Let the read-out digital signal be advanced by the time δ as shown in FIG. 4(c). This advanced read-out digital signal 11 can be considered such that every pulse has been lengthened by the time 2·δ only at positive-going edges. The relation mentioned above suggests that the duty ratio of the read-out digital signal would coincide with the duty ratio of the original digital signal by delaying either positive-going edges or negative-going edges.

FIGS. 5(a)–5(c) show the fact that the duty ratio of the read-out digital signal coincides with the duty ratio of the original digital signal with delaying only positive-going edges by the time 2·δ. FIG. 5(a) shows an original digital signal 12. Positive-going edges of said original digital signal 12 are delayed by the time 2·δ before recording to make a contracted digital signal 13 shown in FIG. 5(b). Said contracted digital signal 13 is recorded on a recording medium. The pulse length of the read-out digital signal increases by the time δ at both sides of the pulse as shown in FIG. 5(c). Therefore, the pulse length of the read-out digital signal becomes equal to the pulse length of the original digital signal.

In the explanation mentioned above, the pulse length of the read-out digital signal is considered to be increased in comparison with the recorded digital signal. When the pulse length of said read-out digital signal is decreased, it is obvious that the duty ratio of the read-out digital signal would coincide with that of the original digital signal by delaying the negative-going edges.

FIGS. 6(a)–6(c) show the opposite case with respect to FIGS. 5(a)–5(c). In this case, it is supposed that the pulse length of a read-out digital signal decreases by the time δ at both sides of the pulse. FIG. 6(a) shows an original digital signal 15. Negative-going edges of the original digital signal 15 are delayed by the time 2·δ before recording to make a stretched digital signal 16 shown in FIG. 6(b). Said stretched digital signal 16 is recorded on a recording medium. The pulse length of the read-out digital signal decreases by the time δ at both sides of the pulse as shown in FIG. 6(c). Therefore, the pulse length of the read-out digital signal becomes equal to the pulse length of the original digital signal.

The present invention provide an apparatus which optically records a digital signal after modulating the pulse length by the method mentioned above.

Figure 7:
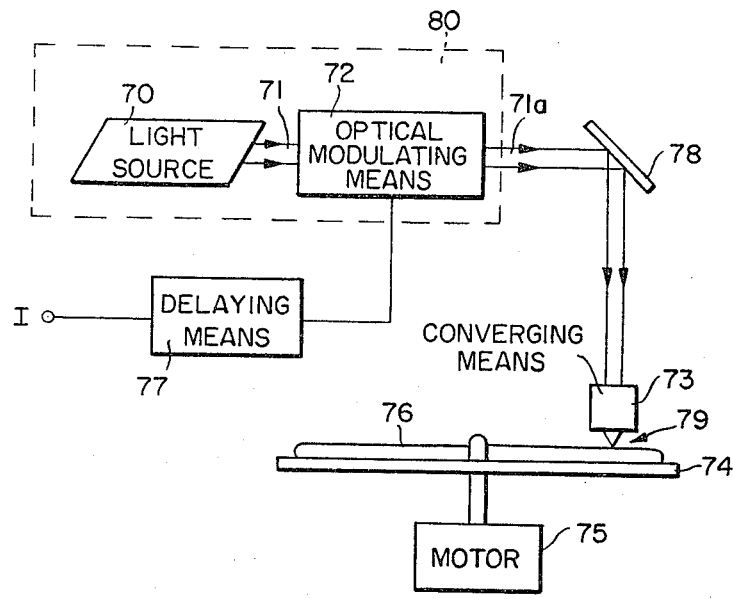
FIG. 7 shows a schematic block diagram of an apparatus embodying the present invention.

FIG. 7 shows a schematic block diagram of an apparatus embodying the present invention. A light source 70 radiates a light beam 71. An Ar ion laser or a laser diode, for example, can be employed for said light source. Said light beam 71 is modulated in its amplitude by the optical modulating means 72 to become the modulated light beam 71a. The elements 70 and 72 constitute a light beam generating means 80 which generates an amplitude-modulated light beam. When a laser diode is employed for said light source 70, said modulating means can be performed by modulating the current which drives said laser diode. That is, the laser diode can constitute the light beam generating means 80 without necessitating provision of the element 72. An electro-optical modulator or an acousto-optical modulator, for example, is generally employed for said optical modulating means 72. Said modulated light beam 71a is reflected by the mirror 78 and is led into the converging means 73 which consists of lenses. Said converging means 73 converges said modulated light beam 71a to form the writing light spot 79 on the recording medium 76. Said recording medium is rotated at a constant velocity on the rotating table 74 which is rotated by the motor 75. Consequently, a written part is formed on said recording medium 76 according to a modulating signal which drives said optical modulating means 72. On the other hand, the digital signal which is to be recorded is fed on the input terminal "I" connected to the delaying means 77. Said delaying means 77 delays either the positive-going edges or the negative-going edges of said digital signal to form said modulating signal which drives said optical modulating means 72. In this way, said digital signal will be recorded on said recording medium and the length of said written part will be controlled by said delaying means.

Figure 8A:
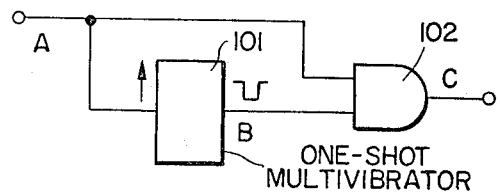
FIGS. 8(a), 8(b) and 8(c) show block diagrams of examples of means according to the present invention for varying pulse lengths.
Figure 8B:
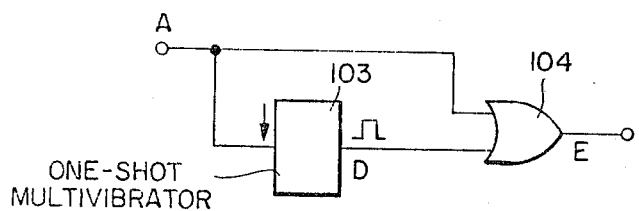
Figure 8C:
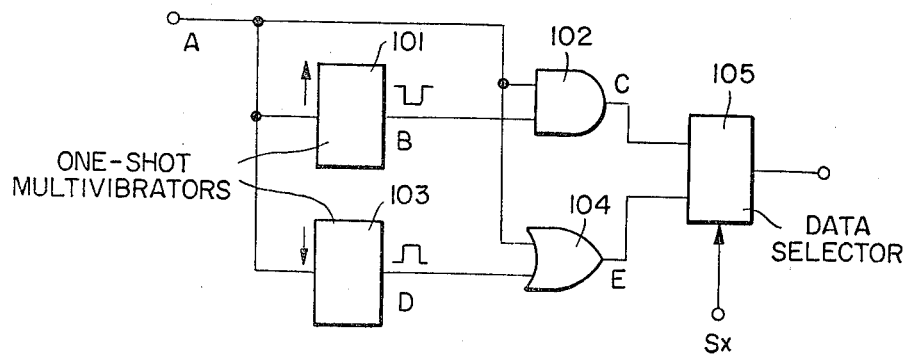

FIGS. 8(a), 8(b) and 8(c) show block diagrams of some examples of means for varying the pulse length. FIG. 8(a) shows an example of a means for contracting the pulse length. FIG. 8(b) shows an example of means for stretching the pulse length. FIG. 8(c) shows an example of a combined means for contracting the pulse length, a means for stretching the pulse length and a means for selecting either of the aforesaid two means.

Waveforms at points A, B, C, D and E in FIGS. 8(a)-8(c) are respectively shown in FIGS. 9(a), (b), (c), (d) and (e). An original digital signal is fed to an input terminal A. The waveform of said original digital signal is shown in FIG. 9(a). The first one-shot multivibrator 101 generates a negative single pulse triggered by a positive-going edge of the original digital signal as shown in FIG. 9(b). An AND gate 102 performs a logical AND operation between the original digital signal and said negative single pulse. The output signal from said AND gate 102 is shown in FIG. 9(c). The positive-going edges of said output signal from the AND gate 102 is delayed, that is, the output signal from the AND gate 102 is the contracted digital signal.

On the other hand, the second one-shot multivibrator 103 generates a positive single pulse triggered by the negative-going edge of the original digital signal as shown in FIG. 9(d). An OR gate 104 performs logical OR operation between the original digital signal and said positive single pulse. The output signal from said OR gate 104 is shown in FIG. 9(e). The negative-going edges of said output signal from the OR gate 104 is delayed, that is, the output signal from the OR gate 104 is the stretched digital signal. Element 105 is a data selector to select either the contracted digital signal or the stretched digital signal according to a control signal $S_x$. The quantity of the variation of the pulse length can obviously be controlled by the time constant of the one-shot multivibrator 101 or 103. If the material of the recording medium is stable, either the example shown in FIG. 8(a) or the example shown in FIG. 8(b) would be chosen according to the characteristic of said material.

Figure 10A:
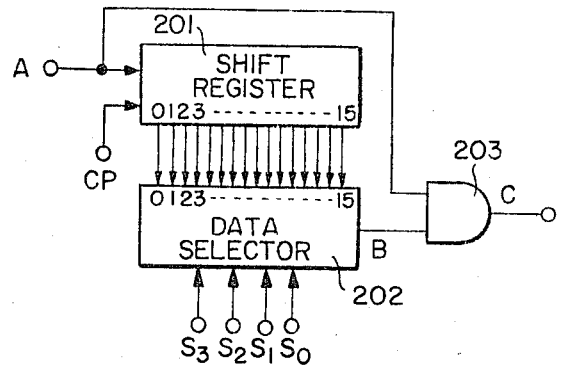
FIGS. 10(a), 10(b) and 10(c) show block diagrams of other examples of means according to the present invention for varying pulse lengths.
Figure 10B:
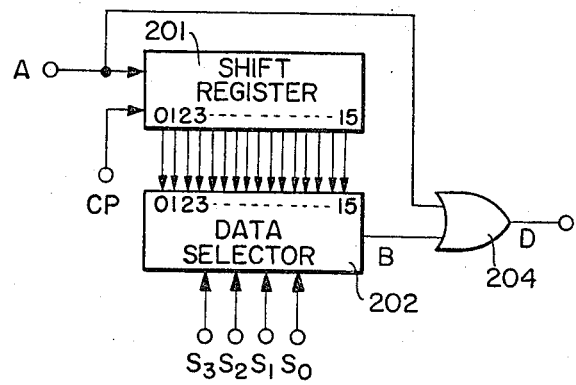
Figure 10C:
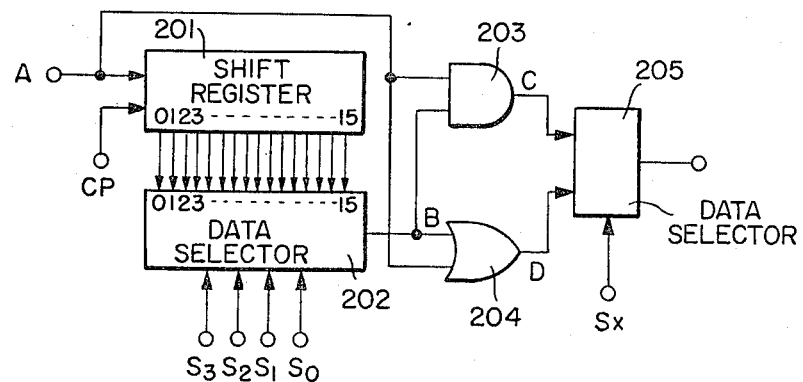

FIGS. 10(a), 10(b) and 10(c) show block diagrams of other examples of means for varying the pulse length. FIG. 10(a) shows an example of a means for contracting the pulse length. FIG. 10(b) shows an example of a means for stretching the pulse length. FIG. 10(c) shows an example of a combined means for contracting the pulse length, a means for stretching the pulse length and a means for selecting either of the two aforesaid means.

Waveforms at points A, B, C and D in FIGS. 10(a)-10(c) are respectively shown in FIGS. 11(a), 11(b), 11(c) and 11(d). An original digital signal is fed to an input terminal A of a shift register 201. The waveform of said original digital signal is shown in FIG. 11(a). Said shift register 201 is driven by a clock pulse CP shown in FIG. 11(e). Parallel output terminals of the shift register 201 are individually connected to input terminals of a data selector 202. In this example, the number of output terminals of the shift register 201 and the number of input terminals of the data selector 202 are both selected to be 16, but do not have to be so restricted. The data selector selects only one input which is transferred toward the output terminal according to control signals $S_1$, $S_1$, $S_2$ and $S_3$. Then, the output signal from the data selector 202 is the delayed signal of the original digital signal as shown in FIG. 11(b). An AND gate 203 performs a logical AND operation between the original digital signal and said delayed signal with respect to the original digital signal. The output signal from said AND gate 203 is shown in FIG. 11(c). This obviously forms the contracted digital signal.

On the other hand, an OR gate 204 performs a logical OR operation between the original digital signal and said delayed signal of the original digital signal. The output signal from said OR gate 204 is shown in FIG. 11(d). This obviously forms the stretched digital signal. Element 205 is a data selector to select either the contracted digital signal or the stretched digital signal according to a control signal $S_x$. The quantity of variation of the pulse length is controlled by control signals $S_0$, $S_1$, $S_2$ and $S_3$. In the case of FIG. 3, when control signals $S_0$, $S_1$, $S_2$ and $S_3$ are fixed so that the delay time of the delayed digital signal becomes $2 \cdot \delta$ as shown in FIG. 11(b), the duty ratio of the read-out digital signal coincides with that original digital signal. If the material of the recording medium is stable, either of example shown in FIG. 10(a) or the example shown in FIG. 10(b) would be chosen according to the characteristic of said material.

In the explanation mentioned above, it has been assumed that said written part is formed corresponding to the positive pulse of said original digital signal, but the present invention is obviously valid for the opposite case. When said written part is formed corresponding to the negative pulse of said original digital signal, the explanation mentioned above becomes proper by exchanging said means for stretching the pulse length and said means for contracting the pulse length.

Although several forms of our invention have been described, it is to be clearly understood that various changes, modifications and other alterations may be made without departing from the scope of the invention.

What is claimed is:

1. An optical recording apparatus for recording a digital signal on a recording medium, comprising: an input terminal to which a digital signal pulse is inputted; a delaying means which is operatively coupled to said input terminal for delaying an edge of said digital signal pulse so as to produce an edge-delayed pulse; a light beam generating means which is operatively coupled to said delaying means for generating a amplitude-modulated light beam under the actuation of said edge-delayed pulse; a converging means which is operatively coupled to said light beam generating means for converging said amplitude-modulated light beam so as to form a writing light spot on said recording medium; and a moving means which is operatively coupled to said recording medium for moving said recording medium at a constant velocity relative to said writing light spot, whereby a length of a written part on said recording medium is controlled by said delaying means.

2. An optical recording apparatus according to claim 1, wherein said light beam generating means comprises a laser diode.

3. An optical recording apparatus according to claim 1, wherein said light beam generating means comprises: a light source for radiating a light beam and a modulating means which is operatively coupled to said light source, and wherein said delaying means is operatively coupled to said modulating means for modulating said light beam with respect to its amplitude so as to generate said amplitude-modulated light beam.

4. An optical recording apparatus according to claim 1, wherein said delaying means delays a positive-going edge of said digital signal pulse.

5. An optical recording apparatus according to claim 4, wherein said delaying means for delaying said positive-going edge comprises a one-shot pulse generating means which generates a single negative pulse when triggered by a positive-going edge of said digital signal pulse and a logic gate which performs a logical AND operation between said digital signal pulse and said single negative pulse.

6. An optical recording apparatus according to claim 4, wherein said delaying means for delaying said positive-going edge comprises a means for delaying said digital signal pulse and a means for performing a logical AND operation between said digital signal pulse and an output signal from said means for delaying.

7. An optical recording apparatus according to claim 1, wherein said delaying means delays a negative-going edge of said digital signal pulse.

8. An optical recording apparatus according to claim 7, wherein said delaying means for delaying said negative-going edge comprises a one-shot pulse generating means which generates a single positive pulse when triggered by a negative-going edge of said digital signal pulse and a logic gate which performs a logical OR operation between said digital signal pulse and said single positive pulse.

9. An optical recording apparatus according to claim 7, wherein said delaying means for delaying said negative-going edge comprises a means for delaying said digital pulse and a means for performing a logical OR operation between said digital signal pulse and an output signal from said means for delaying.

10. An optical recording apparatus according to claims 6 or 9, wherein said means for delaying said digital signal comprises a shift register.

11. An optical recording apparatus for recording a digital signal on a recording medium, comprising: an input terminal to which a digital signal pulse is inputted; a first delaying means which is operatively coupled to said input terminal for delaying a positive-going edge of said digital signal pulse so as to produce a positive-going-edge-delayed pulse; a second delaying means which is operatively coupled to said input terminal for delaying a negative-going edge of said digital signal pulse so as to produce a negative-going-edge-delayed pulse; a selecting means which is operatively coupled to said first delaying means and to said second delaying means for selecting one of either said positive-going-edge-delayed pulse or said negative-going-edge-delayed pulse; a light beam generating means which is operatively coupled to said selecting means for generating an amplitude-modulated light beam under the actuation of an output pulse from said selecting means; a converging means which is operatively coupled to said light beam generating means for converging said amplitude-modulated light beam so to form a writing light spot on said recording medium; and a moving means which is operatively coupled to said recording medium for moving said recording medium at a constant velocity relative to said writing light spot, whereby a length of a written part on said recording medium is controlled by said selected first or second delaying means.

* * * * *